United States Patent
Pokharna et al.

(10) Patent No.: US 7,104,313 B2
(45) Date of Patent: Sep. 12, 2006

(54) APPARATUS FOR USING FLUID LADEN WITH NANOPARTICLES FOR APPLICATION IN ELECTRONIC COOLING

(75) Inventors: Himanshu Pokharna, San Jose, CA (US); Rajiv K. Mongia, Portland, OR (US); Ravi S. Prasher, Chandler, AZ (US); Sridhar V. Machiroutu, Santa Clara, CA (US); Je-Young Chang, San Jose, CA (US); John W. Horigan, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/750,722

(22) Filed: Dec. 31, 2003

(65) Prior Publication Data

US 2005/0139345 A1    Jun. 30, 2005

(51) Int. Cl.
*F28D 15/00* (2006.01)
*C09K 5/00* (2006.01)
*F28F 7/00* (2006.01)

(52) U.S. Cl. .............................. 165/80.4; 165/104.22; 165/104.28; 165/104.33

(58) Field of Classification Search ............... 165/80.2, 165/80.3, 80.4, 104.17–104.22, 905, 104.28, 165/104.33; 252/70, 67, 71; 62/3.1, 3.7; 361/698, 702, 704; 257/714
See application file for complete search history.

(56) References Cited

U.S. PATENT DOCUMENTS

| | | | |
|---|---|---|---|
| 5,641,424 A * | 6/1997 | Ziolo et al. .................... 252/67 |
| 5,731,954 A * | 3/1998 | Cheon .......................... 361/699 |
| 5,763,951 A * | 6/1998 | Hamilton et al. ............ 257/714 |
| 6,432,320 B1 * | 8/2002 | Bonsignore et al. .......... 252/70 |
| 6,447,692 B1 * | 9/2002 | Momoda et al. ............... 252/70 |
| 6,695,974 B1 * | 2/2004 | Withers et al. ................ 252/70 |
| 6,729,383 B1 * | 5/2004 | Cannell et al. ............. 165/80.3 |
| 2003/0062149 A1* | 4/2003 | Goodson et al. ......... 165/104.11 |
| 2003/0209343 A1* | 11/2003 | Bingler ....................... 165/80.4 |
| 2004/0182099 A1* | 9/2004 | Hsu .............................. 62/259 |

* cited by examiner

Primary Examiner—Tho Duong
(74) Attorney, Agent, or Firm—Blakely, Sokoloff, Taylor & Zafman LLP

(57) ABSTRACT

An apparatus for using fluid laden with nanoparticles for application in electronic cooling is described. In one embodiment, an electromagnetic pump is used to circulate the nanoparticle laden fluid.

10 Claims, 2 Drawing Sheets

APPARATUS FOR USING FLUID LADEN WITH NANOPARTICLES FOR APPLICATION IN ELECTRONIC COOLING

FIELD OF INVENTION

The field of invention relates generally to heat management and more particularly to heat management using fluid laden with nanoparticles for application in electronic cooling.

BACKGROUND

One of the significant resistance sources in the liquid cooling of electronics (e.g., computer systems) is the resistance from the cold plate to the fluid. In general, the resistance is a function of flow rate through the cold plate as well as the thermal properties (i.e., conductivity) of the fluid being used and the geometry of the cold plate passages through which the liquid flows.

In one case, the late to fluid resistance may be reduced by increasing the fluid flow rated. However, this leads to increased power consumption, the need for larger a pump, and likely more noise and vibrations.

In the second case, the thermal conductivity of the fluid may be increased. One way to achieve increased thermal conductivity is to use liquid metal as the coolant. A liquid metal's higher thermal conductivity will tend to decrease the plate to fluid resistance. However for the same volumetric flow rates liquid metal has a higher heat exchanger fluid to air thermal resistance relative to water. This is due to the lower heat capacity of liquid metal as compared to water. Therefore, the reduction benefit in junction to ambient resistance will be limited. Furthermore, liquid metal is also considered relatively expensive within the industry of use.

DETAILED DESCRIPTION

An apparatus for using fluid laden with nanoparticles for application in electronic cooling is described. In one embodiment, an electromagnetic pump is used to circulate the nanoparticle laden fluid.

In the following description, numerous specific details are set forth. However, it is understood that embodiments may be practiced without these specific details. In other instances, well-known circuits, structures and techniques have not been shown in detail in order not to obscure the understanding of this description.

Reference throughout this specification to "one embodiment" or "an embodiment" indicate that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. In addition, as described herein, a trusted platform, components, units, or subunits thereof, are interchangeably referenced as a protected or secured.

Figure 1:
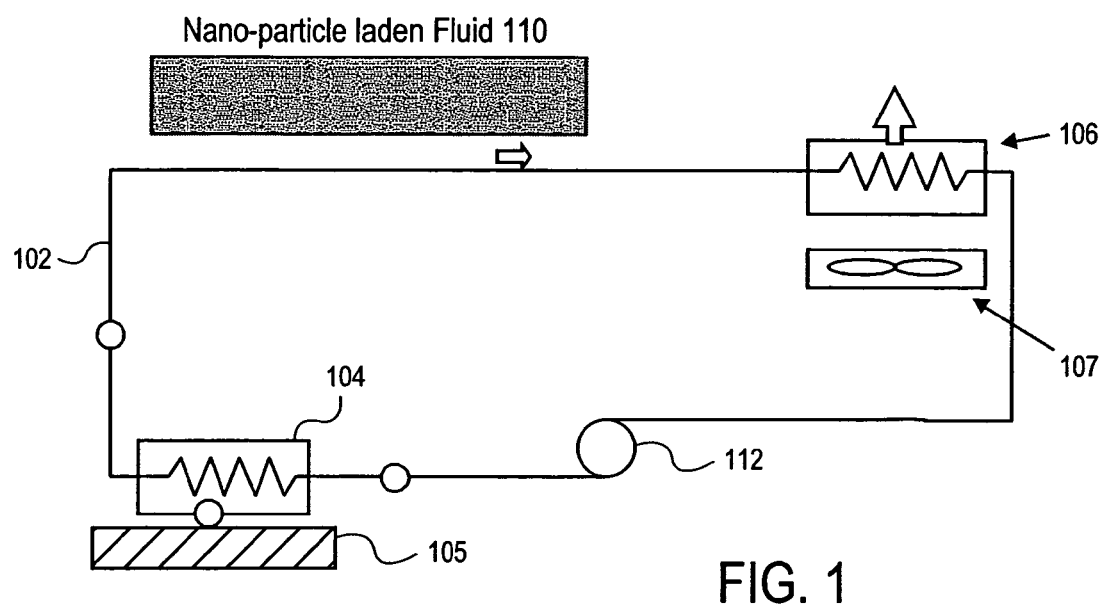
FIG. 1 presents an illustration of a fluid cooling apparatus for use in an electronic application, in accordance with one embodiment.

FIG. 1 illustrates a fluid cooling apparatus for use in an electronic application (e.g., to be used for thermal management within a computer system). As illustrated, the fluid loop 102 is coupled to the cold plate 104 (also referred to herein as a thermally conductive plate). The cold plate 104 is shown to be in thermal contact with a heat generating component 105, such as a processor. Much of the heat generated by the processor is absorbed by the cold plate.

In one embodiment, the fluid loop 102 passes fluid across or through the cold plate 104 to absorb and transfer heat from the cold plate. In one embodiment, the cold plate includes a set of micro channels through which the fluid passes to absorb and transfer the heat from the cold plate.

Thereafter, the fluid of the fluid loop passes through a heat exchanger 106 to dissipate the heat to the atmosphere. In one embodiment, the heat exchanger is a fluid to air heat exchanger, wherein the fluid passes through a set of channels made of thermally conductive material to absorb heat from the water. A fan 107 blows across the channels to release the heat into the ambient air.

In one embodiment, the nanoparticle laden fluid 110 is passed through the fluid loop with nanoparticles, such as copper or ceramic or iron (ferro-nano) particles. In one embodiment, the nanoparticles of the nanoparticle laden fluid 110 includes magnetic nano particles. Use of other materials is also contemplated. As described herein, a nanoparticle consist of a small cluster of atom ranging from 1 to 100 nanometers in size. In alternative embodiments, thermally conductive particles other than nanoparticles may be used, and nanoparticles having a different size than as described herein maybe used.

Use of the thermally conductive nanoparticles in the fluid increases the thermal conductivity of the fluid which results in reduced thermal resistance at the cold plate (i.e., more heat is transferred from the cold plate to the fluid). In one embodiment, a ratio consisting of a range of 0.3% volumetric concentration of 10 nm Copper nanoparticles is used. In alternative embodiments, different ratios of nanoparticles to liquid are contemplated. In one embodiment, the thermally conductive nanoparticles are placed in deionized or ultra pure water, which as described herein includes water from which the majority of ions have been removed. Use of alternative liquids is also contemplated. In yet another embodiments, a different size of nanoparticles is used.

As for application in certain segments like mobile, it is important to have very low flow rate and high efficiency of heat removal, and this technology could be used for use with two-phase loop such that the fluid changes phase from liquid to vapor, and hence, takes benefit of high latent heat of evaporation (as compared with the specific heat). Moreover, the heat transfer coefficient can be order of magnitude higher at the same flow rate.

In one embodiment, nanoparticle laden fluid may be used for two-phase cooling. The nanoparticles in the fluid may assist in increasing the nucleation site density for both evaporation at the chip side heat exchanger (e.g., evaporator or the cold plate 102) and in the condensation at the air side heat exchanger 106.

Figure 2:
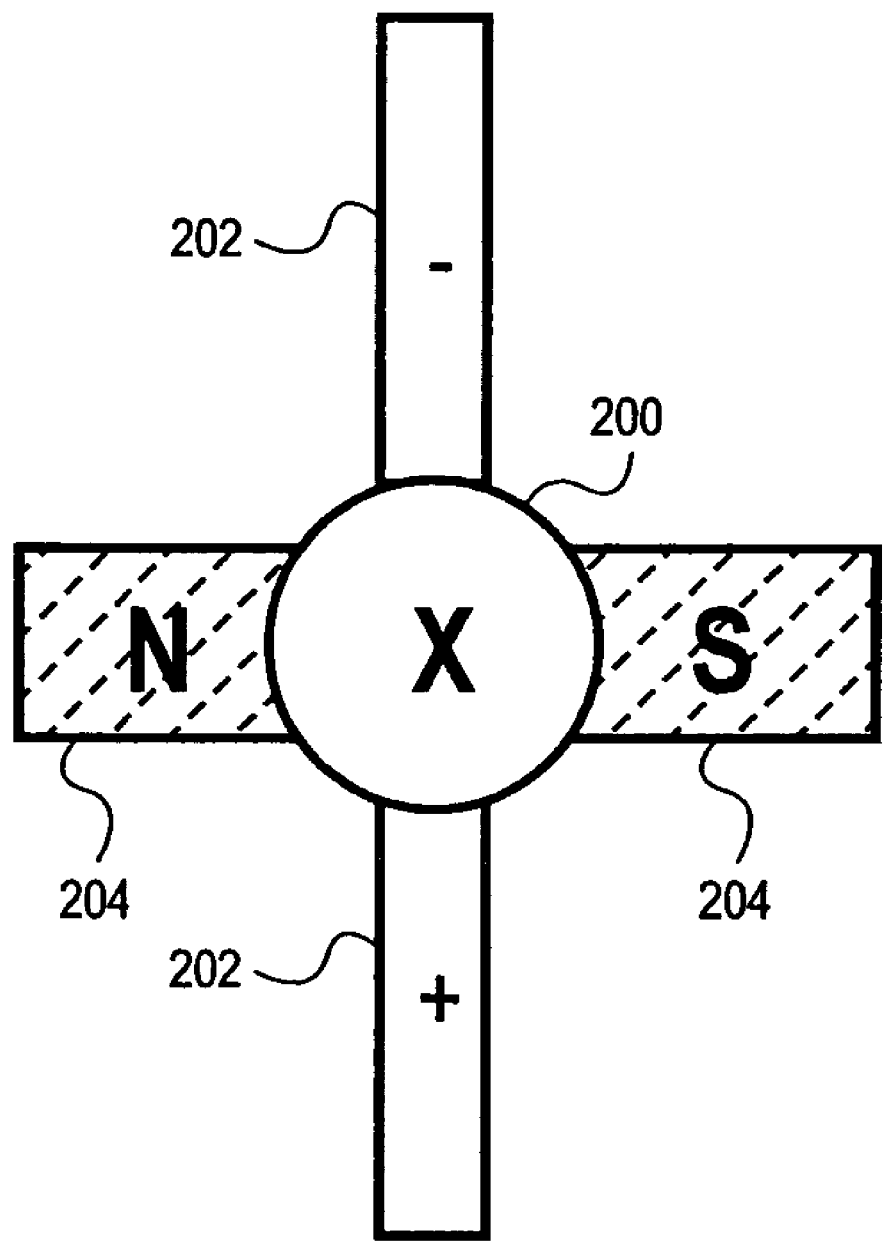
FIG. 2 presents an illustration of an electro magnetic pump used in the fluid cooling apparatus, according to one embodiment.

Further included in the diagram of FIG. 1, is a pump 112 to circulate the fluid through the fluid loop 102. In one embodiment, the fluid is laden with magnetic particles. In alternative embodiments, alternative particles are contemplated. In one embodiment, the pump to circulate the fluid is an electro-magnetic pump, as illustrated in FIG. 2. An electromagnet pump is a pump 200 with perpendicular electrical 202 and magnetic fields 204, which results in a force perpendicular to the direction of the electrical 202 and magnetic fields 204. In one embodiment, the magnitude of this force is equal to the cross product of the electrical 202 and magnetic 204 fields. In one embodiment, the power consumption by the magnetic pump 200 is the square of current flowing through the pump times the electrical resistance through the fluid. Due to the increased electrical conductivity of the fluid laden with nanoparticles, the pump 200 is able to pump the same amount of fluid consuming less power, or otherwise said the efficiency of the pump 200 is improved.

In one embodiment, there are no moving parts in the pump 200 and hence the pump 200 is quiet and can be efficient depending upon the thermal conductivity of the fluid. In one embodiment, the electrical field 202 is provided by an electrically conductive wires placed in contact with the pump. The pump may alternatively use permanent magnets. In one embodiment, to enhance the magnetic field 204, a set of small magnets may be used with a larger magnet with a yoke to focus the magnetic field in the center of the flow passage. Also, in one embodiment, a series of the magnetic pumps can be used to produce a stronger flow of the fluid (e.g., a greater head).

In the foregoing specification, the invention has been described with reference to specific exemplary embodiments thereof. It will, however, be evident that various modifications and changes may be made thereto without departing from the broader spirit and scope of the invention as set forth in the appended claims. For example, the techniques described above may also be used in thermal management applications for alternative heat generating components within a computer system, such as a chipset, a graphics controller, a memory controller, and other alternative heat generating components. The specification and drawings are, accordingly, to be regarded in an illustrative rather than a restrictive sense.

The invention claimed is:

1. An apparatus comprising:
   a thermally conductive plate to be placed in contact with a heat generating device wherein the heat generating device is selected from a group consisting of a processor, a chipset, a graphics controller, and a memory controller;
   a fluid loop coupled to the plate to circulate fluid and have the fluid absorb heat from the plate, the fluid loop to thereafter pass the fluid to a heat exchanger, the fluid containing magnetic nanoparticles and deionized water, to facilitate cooling of the heat generating device; and
   an electro-magnetic pump to circulate the fluid through the fluid loop.

2. The apparatus of claim 1, wherein the fluid loop is coupled to the heat exchanger.

3. The apparatus of claim 1, wherein the nanoparticles are selected from a group comprising of copper, iron, gold and ceramic.

4. The apparatus of claim 1, wherein the fluid loop is a single phase fluid loop.

5. The apparatus of claim 1, wherein the fluid loop is a two phase fluid loop.

6. A system comprising:
   a heat generating device wherein the heat generating device is selected from a group consisting of a processor, a chipset, a graphics controller, and a memory controller;
   a thermally conductive plate in thermal contact with the heat generating device;
   a fluid loop coupled to the plate to circulate fluid and have the fluid absorb heat from the plate, the fluid loop to thereafter pass the fluid to a heat exchanger, the fluid containing deionized water and magnetic nanoparticles, to facilitate cooling of the heat generating device; and
   an electro-magnetic pump to circulate the fluid through the fluid loop.

7. The system of claim 6, wherein the fluid loop is coupled to the heat exchanger.

8. The system of claim 6, wherein the nanoparticles are selected from a group comprising of copper, iron, gold and ceramic.

9. The system of claim 6, wherein the fluid loop is a single phase fluid loop.

10. The system of claim 6, wherein the fluid loop is a two phase fluid loop.

* * * * *